US008580580B2

(12) United States Patent
Sapozhnikov et al.

(10) Patent No.: US 8,580,580 B2
(45) Date of Patent: Nov. 12, 2013

(54) MAGNETIC ELEMENT WITH VARYING AREAL EXTENTS

(75) Inventors: Victor Boris Sapozhnikov, Minnetonka, MN (US); Eric Walter Singleton, Maple Plain, MN (US); Kaizhong Gao, Eden Prairie, MN (US); Dimitar V. Dimitrov, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 270 days.

(21) Appl. No.: 12/752,787

(22) Filed: Apr. 1, 2010

(65) Prior Publication Data

US 2011/0241666 A1 Oct. 6, 2011

(51) Int. Cl.
*H01L 21/00* (2006.01)
*H01L 29/82* (2006.01)
*H01L 21/02* (2006.01)
*G11C 11/00* (2006.01)

(52) U.S. Cl.
USPC ............... 438/3; 257/421; 257/295; 365/158

(58) Field of Classification Search
USPC ................. 257/414, 421; 438/3; 360/319
See application file for complete search history.

(56) References Cited

U.S. PATENT DOCUMENTS

| | | | |
|---|---|---|---|
| 4,799,112 A | 1/1989 | Bremmer et al. | |
| 5,940,240 A | 8/1999 | Kupferman | |
| 6,383,668 B1 | 5/2002 | Fullerton et al. | |
| 6,438,026 B2 | 8/2002 | Gillies et al. | |
| 6,791,806 B1 | 9/2004 | Gao et al. | |
| 6,807,034 B2 * | 10/2004 | Hasegawa et al. | ......... 360/324.2 |
| 6,809,909 B2 | 10/2004 | Hou et al. | |
| 6,898,112 B2 | 5/2005 | Janesky et al. | |
| 7,064,934 B2 | 6/2006 | Mao et al. | |
| 7,226,796 B2 | 6/2007 | Pietambaram et al. | |
| 7,275,304 B2 | 10/2007 | Sakai et al. | |
| 7,280,326 B2 | 10/2007 | Gill | |
| 7,385,842 B2 | 6/2008 | Deak | |
| 7,502,211 B2 * | 3/2009 | Gill | ............................ 360/324.2 |
| 7,616,412 B2 | 11/2009 | Zhu et al. | |

(Continued)

FOREIGN PATENT DOCUMENTS

| | | |
|---|---|---|
| JP | 2002-140805 A | 5/2002 |
| JP | 2003-086860 A | 3/2003 |

(Continued)

OTHER PUBLICATIONS

Jiang et al, "An effective reduction of critical current for current-induced magnetization switching by a Ru layer insertion in a exchange-biased spin valve", PRL, vol. 92, pp. 167204 (2004).*

(Continued)

*Primary Examiner* — Long K Tran
*Assistant Examiner* — Dzung Tran
(74) *Attorney, Agent, or Firm* — Hall Estill Attorneys at Law

(57) ABSTRACT

An apparatus and associated method for a magnetic element capable of detecting changes in magnetic states. Various embodiments of the present invention are generally directed to a free layer that has a first areal extent that is sensitive to a magnetic field and a synthetic antiferromagnetic (SAF) layer adjacent to the free layer and has a second areal extent that is greater than the first areal extent.

21 Claims, 5 Drawing Sheets

(56) References Cited

U.S. PATENT DOCUMENTS

| | | |
|---|---|---|
| 2001/0026470 A1 | 10/2001 | Gillies et al. |
| 2009/0174968 A1* | 7/2009 | Singleton et al. ............. 360/319 |
| 2009/0195941 A1 | 8/2009 | Zhou et al. |
| 2009/0256220 A1* | 10/2009 | Horng et al. .................. 257/421 |

FOREIGN PATENT DOCUMENTS

| | | |
|---|---|---|
| JP | 2003-332652 A | 11/2003 |
| JP | 2005-044490 A | 2/2005 |
| JP | 2007-220154 | 8/2007 |
| JP | 2009-026442 A | 2/2009 |
| JP | 2009-253303 | 10/2009 |
| JP | 2010-016148 | 1/2010 |

OTHER PUBLICATIONS

Sheng-Xian She, Dan Wei, Yang Zheng, Bing-Jun Qu, Tian-Ling Ren, Xi Liu and Fu-Lin Wei, "Micromagnetic Simulation of Transfer Curve in Giant-Magnetoresistive Head," Chin. Phys. Lett., Oct. 2009, vol. 26, No. 12, Chinese Physical Society and IOP Publishing Ltd, China.

* cited by examiner

NEGATIVE MAGNETIC FIELD

NEUTRAL MAGNETIC FIELD

MAGNETIC ELEMENT WITH VARYING AREAL EXTENTS

SUMMARY OF THE INVENTION

Various embodiments of the present invention are generally directed to a memory element capable of detecting changes in magnetic states.

In accordance with various embodiments, a free layer that has a first areal extent that is sensitive to a magnetic field and a synthetic antiferromagnetic (SAF) layer adjacent to the free layer and has a second areal extent that is greater than the first areal extent. In some embodiments, at least a portion of the SAF is programmed to a hard magnetization direction that is maintained by shape anisotropy in response encountering a magnetization field below a predetermined threshold.

These and other features and advantages which characterize the various embodiments of the present invention can be understood in view of the following detailed discussion and the accompanying drawings.

DETAILED DESCRIPTION

The present disclosure generally relates to a magnetic element capable of detecting magnetic fluctuations. As electronics devices become more sophisticated, demand for higher data capacity and improved data transfer rates have placed added emphasis on the physical size of components that read and write data. With a large segment of data storage being conducted through the use of magnetic storage, the size of magnetic elements that are sensitive to changes in magnetic fluctuations plays an ever important role.

Accordingly, a magnetic element can have a reduced physical size with a free layer that is sensitive to magnetic field and an SAF layer that is programmed to a hard direction and maintained in the hard direction with shape anisotropy corresponding to the larger areal extent of the SAF layer compared to the free layer. That is, the larger areal extent of the SAF layer provides magnetic stability through shape anisotropy which eliminates the need for secondary layers, such as anti-ferromagnetic (AFM) layers, in the magnetic element that are intended to stabilize the SAF layer. As a result, the magnetic element can have an improved resolution capable of reading data from smaller and smaller portions of a data storage media.

In magnetic storage devices, the ability to decrease the width of data tracks while maintaining proper alignment of data transducers can be accomplished by decreasing the operational width of at least one transducing magnetic element. Thus, a magnetic device can have increased capacity through the incorporation of transducing elements with reduced operational width which corresponds to a finer areal resolution.

Figure 1:
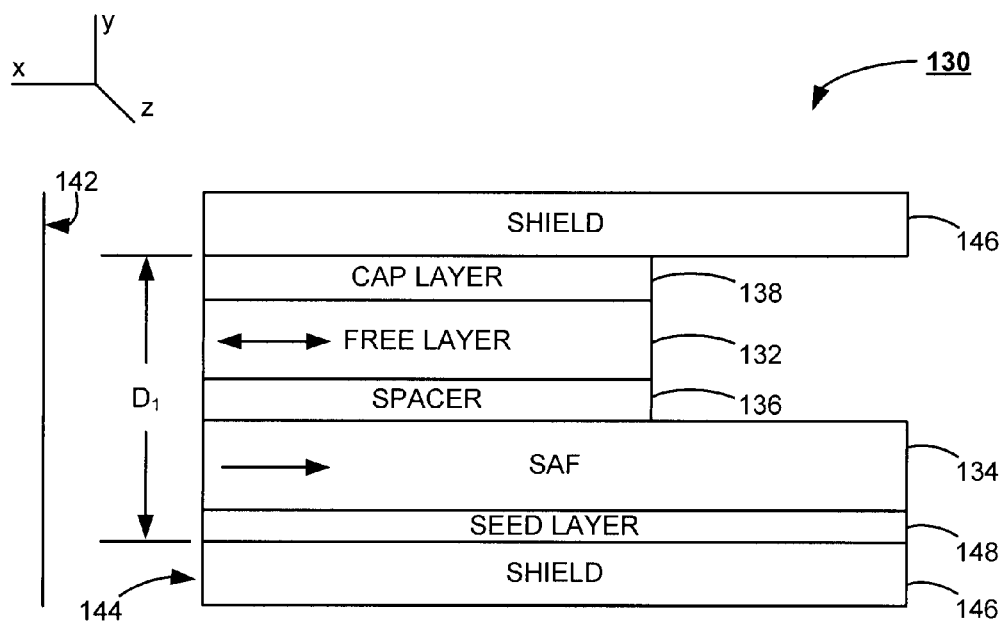
FIG. 1 generally illustrates an exemplary magnetic element.

FIG. 1 displays an exemplary block representation of a magnetic element 130 capable of being used in a magnetic storage device. The element 130 can be constructed with a ferromagnetic free layer 132 that is sensitive to external magnetic fields. That is, the free layer 132 can have a magnetization that corresponds to an encountered external magnetic field. The free layer 132, in some embodiments, can be coupled to a multi-layer synthetic antiferromagnetic (SAF) layer 134 via a non-magnetic spacer layer 136, such as an oxide of $MgO$, $Al_2O_3$, $TiOx$.

In various embodiments, at least a portion of the SAF layer 134 is set to a hard programming direction so that the SAF layer 134 is not responsive to an external magnetic field below a predetermined programming threshold. For example, the SAF layer 134 may be set to the hard programming direction with a large magnetization and is subsequently not sensitive to magnetic fields lower than the large magnetization.

Without an external magnet ensuring the magnetization of at least a portion of the SAF layer 134, magnetic destabilization can occur that renders the SAF layer 134 responsive to low magnetic fields. Accordingly, the SAF layer 134 can be enlarged to have an areal extent that is greater than the areal extent of the free layer 132. Such configuration can create hard and easy programming directions for the SAF layer 134 and create a stable magnetization due to shape anisotropy and antiferromagnetic interactions in the SAF layer 134.

As shown, the magnetic element 130 can have a cap layer 138 contactingly engaging the free layer 132 and providing a default magnetization. That is, the cap layer 138 can be a hard magnet with a predetermined magnetization that is large enough to influence the free layer 132 into the predetermined magnetization, but not large enough to prevent the free layer 132 from being sensitive to external magnetic fields. It should be noted that the cap layer 138 is not required to be present or limited to a certain size and magnetization and can be a variety of materials.

In some embodiments, a default magnetization can be set for the free layer 132 by an abutting junction is formed adjacent to each side of the free layer 132 along an axis that is normal to the axis of magnetization of the free layer 132. That is, magnetic material can be oriented adjacent the free layer 132, such as along the "z" axis shown in FIG. 1, without increasing the operational extent of the magnetic element 130. The inclusion of an abutting junction can allow the cap layer 138 to be a non-magnetic spacer that can be a reduced size and result in a smaller operational extent $D_1$ for the magnetic element 130.

In an exemplary operation, the free layer 132 has a predetermined magnetization that is reversed or amplified in response to encountering programmed magnetic bits on a data storage media 142 across an air bearing surface 144. As such, the magnetization of the free layer 132 will change in response to encountering the magnetic bits. However, upon leaving a magnetic bit, the free layer 132 will return to the default magnetization due to the lack of another external magnetic field.

The magnetic element 130 can further be constructed with one or more shields 146 that define the operational extent $D_1$ and physical size of the element 130. In an exemplary operation, the shields 146 can narrow the scope of the magnetic element 130 to a predetermined portion of the storage media 142 while preventing extraneous magnetic fields or bits from outside the predetermined scope from affecting the various layers of the magnetic element 130. A seed layer 148 can optionally be positioned between a shield layer 146 and the SAF layer 134 to inhibit inadvertent magnetic effects from the reaching the SAF layer 134. It should be noted that the shields 146 are not limited to a specific configuration or construction and can be made from a variety of materials with varying magnetic characteristics.

With the magnetic element 130 having a magnetically stable SAF layer 134, a stabilizing layer is not necessary and the operational extent $D_1$ of the element 130 is reduced. In some embodiments, operational extent $D_1$ is less than or equal to a predetermined amount, such as, but not limited to, 15 nm and 20 nm. The removal of the stabilizing layer can reduce the operational extent $D_1$ by 6-7 nms in various embodiments. Such reduction in width can allow for the detection of magnetic bits in a more precise area of the storage media. It can be appreciated that such increase in magnet bit density can allow for a higher overall data capacity for a data storage device, such as the device 100, that utilizes multiple data storage medias 142.

In some embodiments of the present invention, the various layers of the magnetic element 130 are constructed of different materials to more precisely and correctly detect external magnetization fields. It can be appreciated that the assorted layers of the magnetic element 130 are not limited to a particular material, compound, or alloy and the various layers can be constructed in a variety of combinations that result in the reduction in the magnet element's 130 size.

One such embodiment has the free layer 132 constructed of CoFe alloy, NiFe alloy, CoNiFe alloy, or CoFeB alloy, while at least a portion of the SAF layer 134 is CoFe or CoFeB. Meanwhile, the shields 146 can be made from various alloys such as, but not limited to, NiFe, NiFeCu, and NiCoFe. Various constructions of the magnetic element 130 can further include configuring the cap and seed layers 138 and 148 to be varying magnetizations to allow for an abutted junction configuration that can include various differing materials, such as a non-magnetic material for the seed layer 148 and a magnetic material for the cap layer 138, such as a permanent magnet.

In yet another alternate embodiment, the cap and seed layers 138 and 148 can be constructed to be spin-tunneling layers that set incoming current to a predetermined spin orientation. The various exemplary constructions of the magnetic element 130 can further include the SAF layer 134 having a height, along the "x" axis in FIG. 1, that is a predetermined ratio compared to the free layer 132. For example, the SAF layer 134 can be configured to be a predetermined multiple of the height of the free layer 132 such as, but not limited to, at least 1.5 and 2 times, which corresponds to a larger areal extent.

Figure 2A:
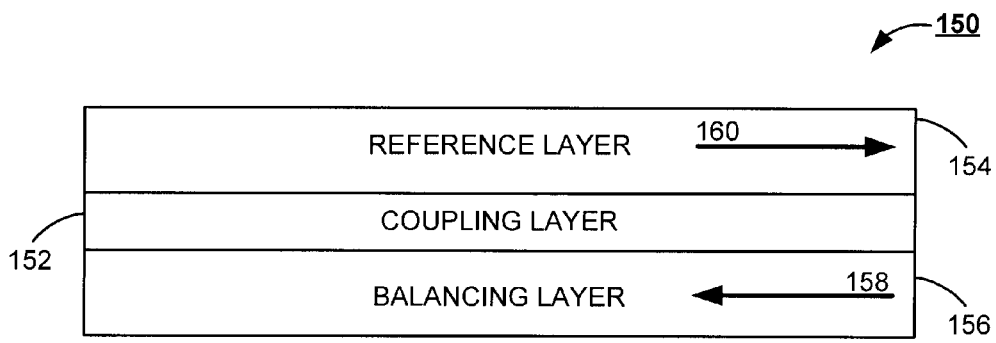
FIGS. 2A and 2B show a portion of the exemplary magnetic element of FIG. 1 as constructed and operated in accordance with various embodiments of the present invention.
Figure 2B:
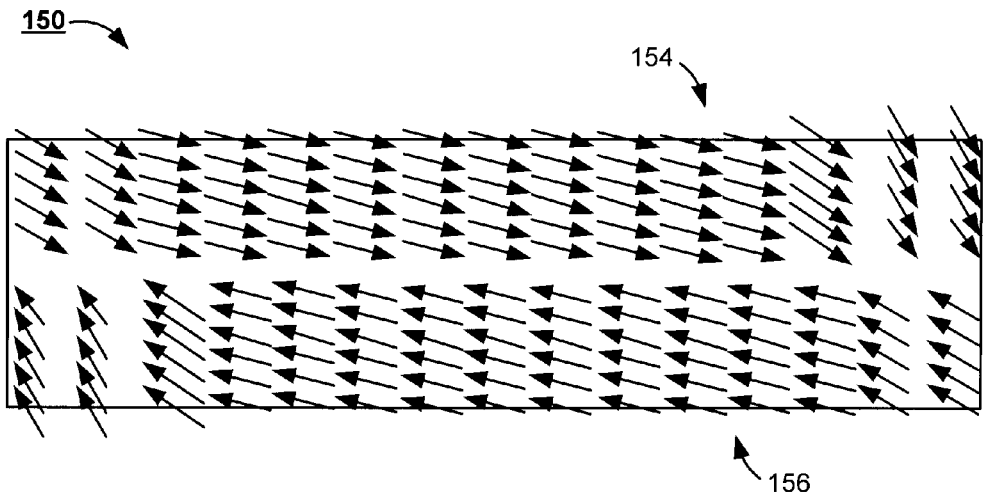

FIGS. 2A and 2B show an exemplary SAF layer 150 as constructed and operated in accordance with various embodiments of the present invention. A non-magnetic coupling layer 152, such as Ru, is disposed between and in contacting engagement with a reference layer 154 and a balancing layer 156, that can be constructed of various single and multi-layered structures and materials such as CoFe alloy, CoFeB alloy, and CoNiFe alloy. In some embodiments, the balancing layer 156 is configured to be set in a hard programming direction, as shown by arrow 158. As a result of antiferromagnetic interaction between the layers, the reference layer 154 would be anti-parallel to the balancing layer 146, as displayed by arrow 160.

As shown in FIG. 2A, the SAF layer 150 can concurrently have magnetizations in opposing directions. The differing magnetization can result in a zero net magnetization with respect to the entire SAF layer 150. Furthermore, the SAF layer 150 can provide a stable magnetization of both the balancing and reference layer 156 and 154 due to shape anisotropy while having minimal magnetization effect on adjacent layers of a magnetic element, such as the free layer of FIG. 1. Such characteristics can allow for a reliable reference magnetization that can be used to quickly and efficiently sense external magnetic fields.

FIG. 2B generally illustrates an exemplary micromagnetic model of the SAF layer 150. While the extended length of the SAF layer 150 can allow for stable magnetizations due to shape anisotropy, the magnetizations are often not uniform throughout the layers. That is, a lack of external hard magnet "pinning" the magnetization of one or more of the layers of the SAF layer 150 results in shape anisotropy resisting magnetization destabilization, but not a plurality of differing micromagnetization directions. However, it should be noted that while various micromagnetization directions can be present, the overall magnetizations of the balancing layer 156 and reference layer 154 remain anti-parallel with the balancing layer 156 set in the hard programming direction.

Figure 3A:
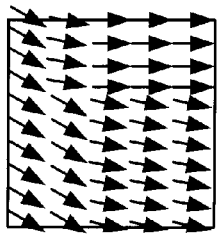
FIGS. 3A-3C display a portion of the magnetic element of FIG. 1 as operated in accordance with various embodiments of the present invention.
Figure 3B:
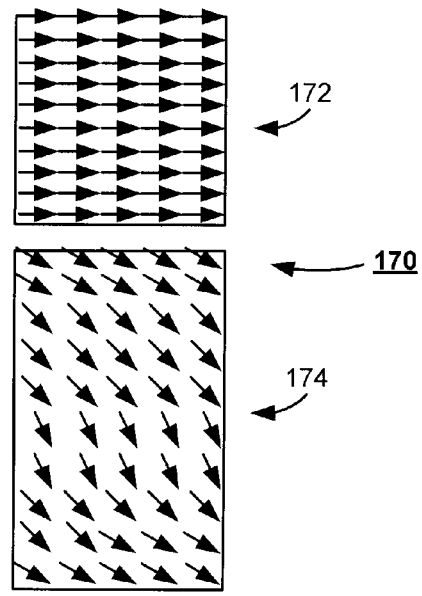
Figure 3C:
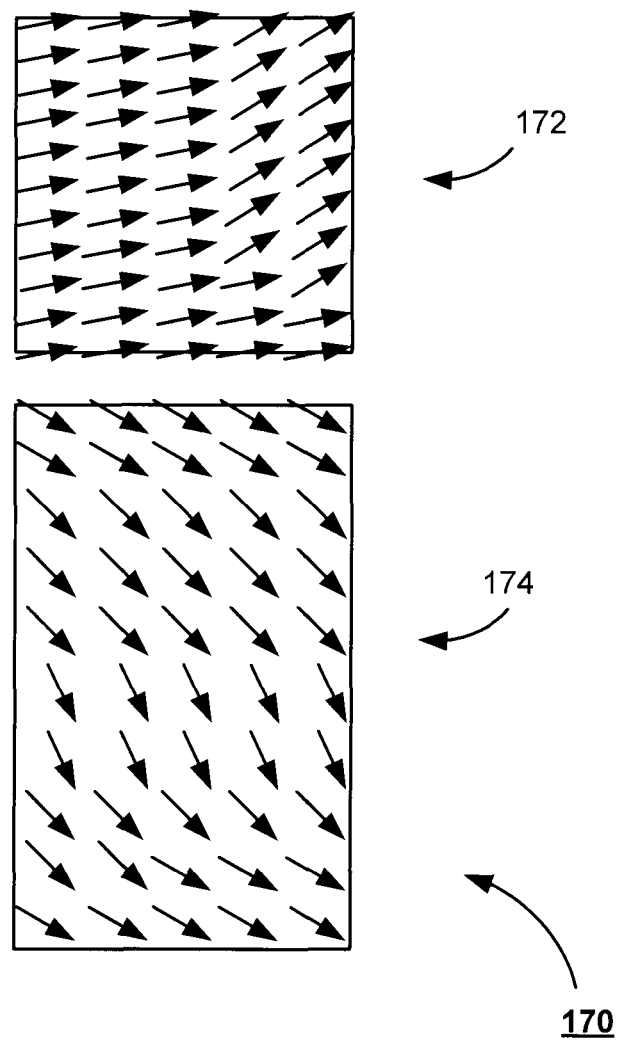

In FIGS. 3A-3C, an exemplary sensor stack 170 portion of the magnetic element 130 of FIG. 1 is displayed in under various external magnetic conditions. It should be noted that the sensor stack 170 has a free layer 172 adjacent to a reference layer 174. It can be appreciated that the reference layer 174 can be a separate layer or part of a composite layer, such as the SAF layer 150 of FIGS. 3A and 3B.

FIG. 3A displays the sensor stack 170 in response to a negative magnetic field. As shown, the free layer 172 has a plurality of micromagnetic directions, but has an overall consensus magnetization. Similarly, the reference layer 174 also has a non-uniform micromagnetization model, but an overall stable magnetization. It has been observed that the various micromagnetization directions are tilted towards the direction of the external magnetic field, such as the air bearing surface of FIG. 1.

FIG. 3B illustrates the sensor stack 170 in the absence of an external magnetic field. The free layer 172 has a substantially uniform magnetization that may be attributed to a biasing field from an adjacent hard magnet, such as the cap layer of FIG. 1. However, the non-uniform orientation of the micromagnetizations in the reference layer 174 remains despite a lack of external magnetic influence. Such a characteristic may be attributable to the shape anisotropy of the reference layer 174 providing stable, but varying, magnetization through the reference layer 174.

FIG. 3C further displays the sensor stack 170 while encountering a positive magnetic field. It can be observed that the free layer 172 takes a non-uniform micromagnetization that trends in an opposite manner than shown in FIG. 3A while producing the same overall magnetization direction. The various magnetizations of the sensor stack 170 are mere exemplary and evidence various modeled observations for a reference layer that is magnetically stable based on shape anisotropy instead of an external "pinning" structure.

Figure 4:
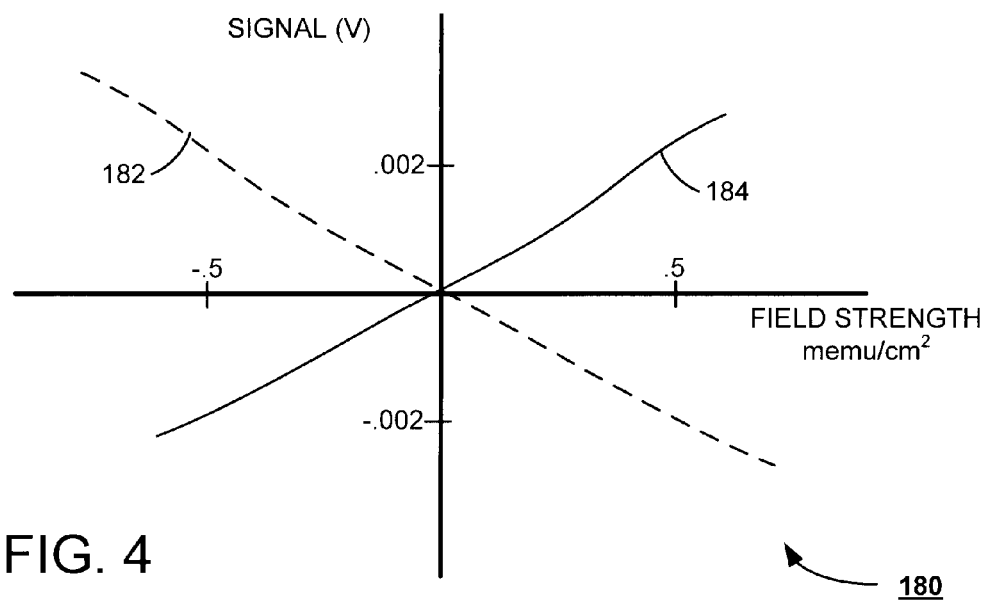
FIG. 4 graphs exemplary operations of the magnetic element of FIG. 1 as operated in accordance with various embodiments of the present invention.

Such observations have further yielded data used to model exemplary transfer curves 180, as graphed as milli-electromagnetic units ("memu") per centimeter squared and signal strength in volts in FIG. 4. The first and second transfer curves 182 and 184 display the substantially linear behavior of the sensor stack 170 of FIGS. 3A-3C and the corresponding magnetic element 130 of FIG. 1. Curve 182 represents an exemplary SAF stripe height that corresponds to 150 nm or 250 nm and an exemplary free layer stripe height of 50 nm while curve 184 represents an exemplary SAF stripe height of 75 nm and a free layer stripe height of 50 nm. However, it should be noted that such exemplary stripe heights are not required or limited and other stripe heights can also exhibit the behavior illustrated in FIG. 4. Such linear behavior can correspond to head linearity and provide enhanced accuracy and efficiency in combination with the ability to detect smaller magnetic bits associated with increased data capacity.

Figure 5:
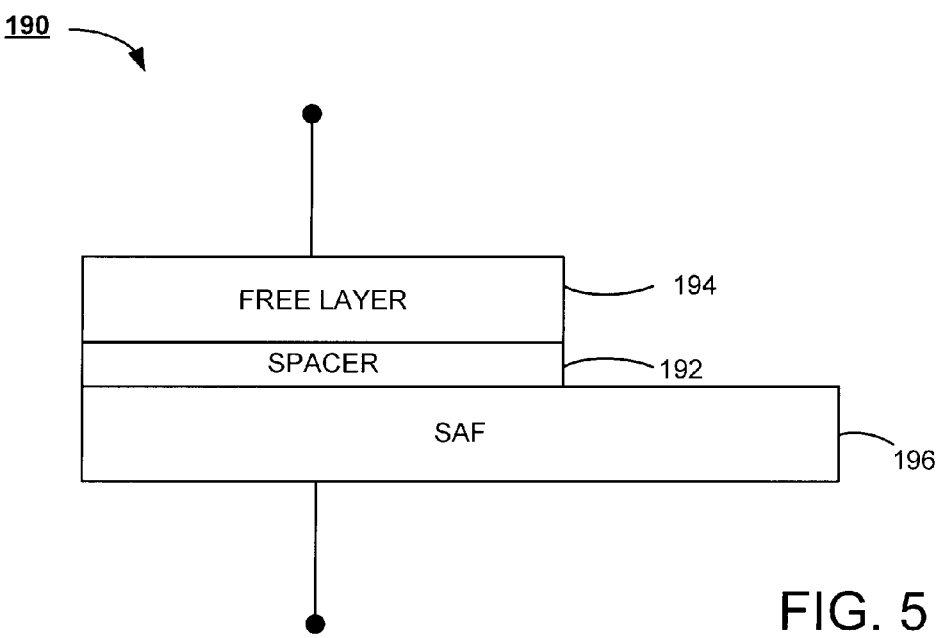
FIG. 5 provides an exemplary magnetic element constructed in accordance with various embodiments of the present invention.

FIG. 5 generally illustrates a magnetic element 190 in accordance with various embodiments of the present invention. As shown in one exemplary embodiment, a spacer layer 192 is disposed between a free layer 194 and an SAF layer 196 that has an areal extent that is greater than the areal extent of the free layer 194. The greater areal extent can provide a stable magnetization in a hard programming direction that allows the magnetic element 190 to operate as a memory cell. That is, the SAF layer 196 can provide a reference magnetization that can be comparable to the magnetization of the free layer 194 to render a programmable logic state.

In such an exemplary embodiment, the free layer 194 can be constructed with various materials such as, but not limited to, CoFe, CoFeB, NiFe, CoNiFe, or a multilayered structure of CoFeB and NiFe. Meanwhile, the spacer layer 192 can be an oxide such as MgO, $Al_2O_3$, $TiO_x$, or a single metallic material.

Further in the exemplary embodiment, the free layer 194 can be set to one of two opposing magnetizations that, in combination with the reference magnetization of the SAF layer 196, can provide a bi-stable non-volatile element that can be accurately and efficiently operated. It can be appreciated that the operation of the various layers and the element 190 are not limited to a particular programming operation that stores a selected logical state in the element 190.

However, in some embodiments the element 190 functions to store a first logical state by passing a programming current through the element 190 in a first direction or to store a second logical state by passing a programming current through the element in an opposing direction from the first direction. The magnetic element 190 can have one or more additional magnetic layers that can allow the element 190 to operate as a variety of data storage elements, such as a spin polarizing and resistive random access memory.

It should be noted that the magnetic element 190 is not limited to the configuration shown in FIG. 5 and can be constructed in various orientations and materials, as desired. For example, the free layer 194 can be a CoFe compound, the spacer layer 192 can be a non-magnetic material such as Ru, and the SAF layer 196 can be a composite layer of multiple materials which provide a zero net magnetization and a reference magnetization.

Figure 6A:
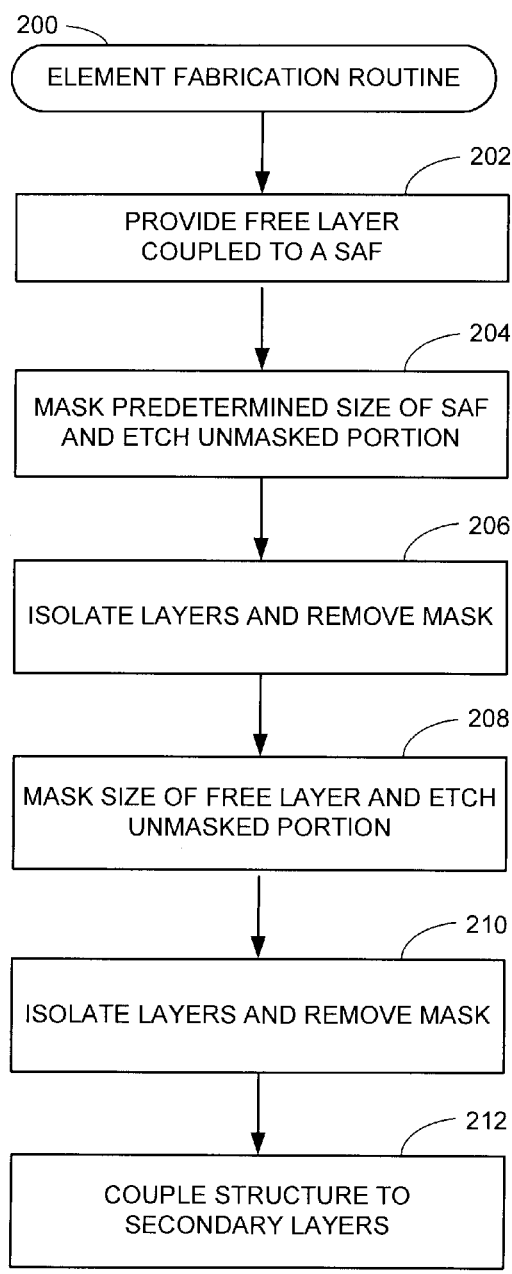
FIG. 6A shows a flowchart of an exemplary element fabrication routine carried out in accordance with various embodiments of the present invention.
Figure 6B:
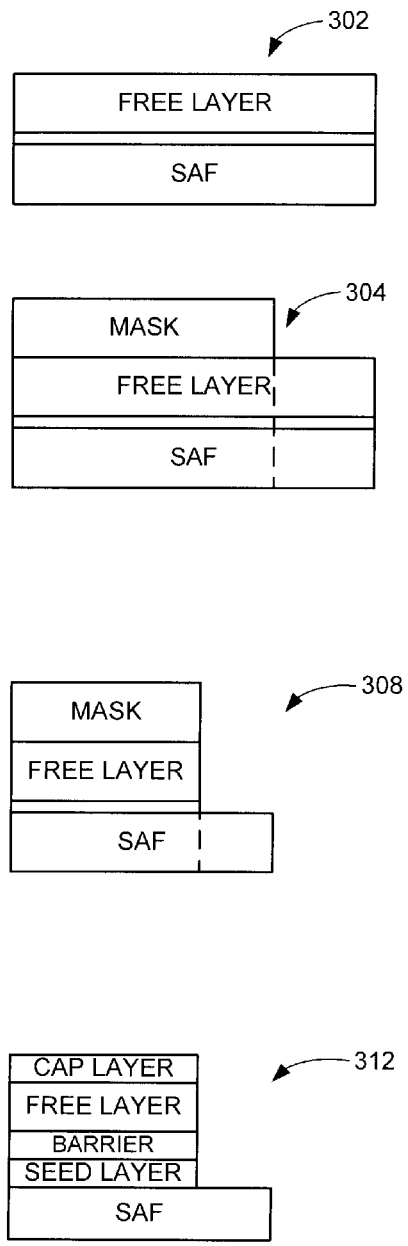
FIG. 6B generally illustrates exemplary portions of the element fabrication routine of FIG. 6A.

FIGS. 6A and 6B display a flowchart 200 and associated block representation 300 of an exemplary element fabrication routine conducted in accordance with various embodiments of the present invention. The routine 200 initially provides a free layer that is coupled to an SAF layer in step 202, which is illustrated with magnetic stack 302. A mask of a predetermined size is subsequently applied to the magnetic stack to which a portion of the unmasked area of the stack is etched and removed in step 204, as shown in stack 304.

Step 206 applies an isolation material and removes the mask from step 204. Afterward, a different mask of a different predetermined size is applied in step 208 and at least a portion of the uncovered free layer is removed through etching to create a difference in areal extent of the free layer in relation to the SAF layer, as displayed in stack 308. The mask material is then removed after an isolation material is applied to the stack in step 210. Finally in step 212, the stack is coupled to at least one secondary layer, such as a cap layer affixed to the free layer as displayed in stack 312. The routine 200 is not limited to the embodiment displayed in FIGS. 6A and 6B and can be modified without deterring from the spirit of the present invention. That is, steps can be moved or eliminated to create a magnetic stack that has a similar or different configuration than the stack 312. For example, a step can be added that defines a back edge of the magnetic stack. Moreover, the routine 200 can have extra steps added to create various configurations of a magnetic stack.

It should be noted that for the purposes of the present application the term "areal extent" relates to the exterior dimensions of a layer of the magnetic element. That is, a layer with a greater areal extent is one in which the exterior dimensions extend beyond that of a layer with a lesser areal extent. For example, a greater areal extent can be a layer having one or more greater lengths, widths, depths, and surface areas relative to another layer.

In some embodiments, the removal of material is facilitated by ion milling or reactive etching. Additionally, the magnetic stack can be constructed using wafer level processing that defines predetermined dimensions while deposing magnetic materials. The magnetic stack can also be defined by subtractive and additive processes in isolation or in combination with lapping processes that may define particular surfaces of the stack.

It can be appreciated that the material and geometrical characteristics of the magnetic element described in the present disclosure allows for advantageous detection of magnetic fields. Moreover, the various embodiments discussed herein can provide reduced shield-to-shield spacing that allows for improved areal resolution. In addition, while the embodiments have been directed to detection of magnetic fields, it will be appreciated that the claimed invention can readily be utilized in any number of other applications, including as a bi-stable non-volatile memory elements.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising:
   an air bearing disposed between a data storage media and an air bearing surface (ABS);
   a free layer with a first areal extent that is sensitive to a magnetic field, the first areal extent corresponding to a first stripe height as measured from and along an axis orthogonal to the ABS, the free layer biased to a default magnetization by a contactingly adjacent cap layer; and
   a synthetic antiferromagnetic (SAF) layer with a second areal extent corresponding to a second stripe height as measured from and along an axis orthogonal to the ABS, the second areal extent being greater than the first areal extent.

2. The apparatus of claim 1, wherein at least a portion of the SAF is programmed to a hard magnetization direction that is maintained by shape anisotropy in response to encountering a magnetization field below a predetermined threshold.

3. The apparatus of claim 1, wherein the SAF comprises a reference layer and a balancing layer each in contacting engagement with a coupling layer disposed therebetween.

4. The apparatus of claim 3, wherein the balancing layer has a first magnetization orientation and the reference layer has a second magnetization orientation that is opposite of the first magnetization orientation.

5. The apparatus of claim 3, wherein reference and balancing layers each have non-uniform micromagnetic structures that comprise a plurality of differing magnetization orientations.

6. The apparatus of claim 1, wherein the cap layer comprises a permanent magnet that sets the default magnetization in the free layer.

7. The apparatus of claim 1, wherein the cap layer is configured in an abutted junction about the free layer to maintain the default magnetization until an external magnetization field from an encountered magnetic data bit.

8. The apparatus of claim 1, wherein the second areal extent is at least 1.5 times longer than the first areal extent.

9. The apparatus of claim 1, wherein the free layer is bi-stable and can permanently store a magnetization as non-volatile memory.

10. The apparatus of claim 1, wherein the free layer and SAF layer are disposed between a first and second magnetic shield layer.

11. The apparatus of claim 2, wherein the SAF layer has an easy magnetization direction that is sensitive to magnetic fields from an encountered magnetic data bit.

12. The apparatus of claim 1, wherein the free layer comprises at least a CoFe based alloy and the SAF comprises at least a plurality of CoFe based alloys.

13. The apparatus of claim 1, wherein neither the free layer nor the SAF layer are in contacting engagement with an antiferromagnetic layer.

14. A method comprising:
    masking a first areal extent of a magnetically sensitive free layer and coupled with a synthetic antiferromagnetic (SAF) layer, the free layer biased to a default magnetization by a contactingly adjacent cap layer having the first areal extent, the first areal extent corresponding to a first stripe height as measured from and along an axis orthogonal to an air bearing surface (ABS), the ABS separated from a data storage media by an air bearing;
    etching an unmasked portion of the free layer and SAF layer so that the SAF layer has the first areal extent;
    masking a second areal extent of the free layer corresponding to a second stripe height as measured from and along an axis orthogonal to the ABS; and
    etching a second unmasked portion of the free layer so that the free layer has the second areal extent and the first areal extent is greater than the second areal extent.

15. The method of claim 14, further comprising the programming at least a portion of the SAF layer to a hard magnetization direction that is maintained by shape anisotropy in response to encountering a magnetization field below a predetermined threshold.

16. The method of claim 14, wherein the SAF layer has a zero net magnetization and a plurality of layers that have opposing magnetizations.

17. The method of claim 14, wherein the SAF layer has a balancing layer and a reference layer, one of which is programmed to a hard direction while the other is programmed to an easy magnetization direction.

18. The method of claim 14, wherein the masking of the first and second areal extents are respectively removed after each etching step.

19. A magnetic sensor comprising:
    an air bearing disposed between a data storage medium and an air bearing surface (ABS);
    a free layer in perpendicular orientation with the data storage medium comprising a first stripe height that extends normal to the data storage medium a first distance, the free layer biased to a default magnetization by a contactingly adjacent cap layer configured with the first stripe height and of a spin-tunneling material;
    a synthetic antiferromagnetic (SAF) layer adjacent the free layer with a second stripe height that extends normal to the data storage medium a second distance that is greater than the first distance; and
    an operational extent between a first shield and a second shield, the operational extent being less than or equal to 20 nm.

20. The magnetic sensor of claim 19, wherein the first height is equal to 50 nm and the second height is greater than or equal to 75 nm.

21. A stack comprising a magnetically free layer with a first areal extent coupled with a synthetic antiferromagnetic (SAF) layer with a second areal extent that is greater than the first areal extent.

* * * * *